United States Patent
Drofenik et al.

(10) Patent No.: US 11,480,602 B2
(45) Date of Patent: Oct. 25, 2022

(54) TRANSFORMER ASSEMBLY WITH MEDIUM FREQUENCY TRANSFORMERS

(71) Applicant: ABB Schweiz AG, Baden (CH)

(72) Inventors: Uwe Drofenik, Zürich (CH); Thomas Gradinger, Aarau Rohr (CH); Francisco Canales, Baden-Dättwil (CH)

(73) Assignee: ABB Schweiz AG, Baden (CH)

( * ) Notice: Subject to any disclaimer, the term of this patent is extended or adjusted under 35 U.S.C. 154(b) by 284 days.

(21) Appl. No.: 16/925,999

(22) Filed: Jul. 10, 2020

(65) Prior Publication Data

US 2021/0018554 A1    Jan. 21, 2021

(30) Foreign Application Priority Data

Jul. 16, 2019  (EP) .................................... 19186462

(51) Int. Cl.
*H01F 27/32*  (2006.01)
*G01R 31/12*  (2020.01)
(Continued)

(52) U.S. Cl.
CPC ......... *G01R 31/1227* (2013.01); *G01R 31/14* (2013.01); *G01R 31/62* (2020.01);
(Continued)

(58) Field of Classification Search
CPC .... G01R 31/1227; G01R 31/14; G01R 31/62; H01F 27/32; H01F 27/402; H01F 2038/006; H01F 38/16; H01F 27/321; H02H 3/22; H02M 1/007; H02M 1/0074; H02M 7/4807; H02M 7/81; H02M 5/225; H02M 7/23; H02M 5/00; H02M 5/10; H02M 7/04; H02M 1/0067
See application file for complete search history.

(56) References Cited

U.S. PATENT DOCUMENTS 3,820,006 A * 6/1974 Phillips ............... H02M 7/5233
                                                    363/96
9,437,356 B2    9/2016 Kramer et al.

FOREIGN PATENT DOCUMENTS

CH       706337 A2    10/2013
CN     204119215 U     1/2015
(Continued)

OTHER PUBLICATIONS

Isler Stephane et al: "Development of a 100 kW, 12.5 kV, 22 kHz and 30 kV insulated medium frequency transformer for compact and reliable medium voltage power conversion", 2017 19th European Conference on Power Electronics and Applications (EPE '17 ECCE Europe), Jointly Owned IEEE-PELS and EPE Association, Sep. 11, 2017 XP033250578 10 pages.
(Continued)

*Primary Examiner* — Tuyen T Nguyen
(74) *Attorney, Agent, or Firm* — Whitmyer IP Group LLC

(57) ABSTRACT

Transformer assembly including a first transformer stage having a plurality of first-stage transformer cells; and a second transformer stage. An input of the second transformer stage is connected to an output of the first transformer stage. A lightning impulse breakdown voltage of a transformer cell of the second stage is at least double of a lightning impulse breakdown voltage of transformer cells of the first stage.

18 Claims, 2 Drawing Sheets

(51) Int. Cl.
  G01R 31/62    (2020.01)
  G01R 31/14    (2006.01)
  H01F 27/40    (2006.01)
  H02H 3/22     (2006.01)
  H01F 38/00    (2006.01)

(52) U.S. Cl.
  CPC ........... *H01F 27/32* (2013.01); *H01F 27/402* (2013.01); *H02H 3/22* (2013.01); *H01F 2038/006* (2013.01)

(56) References Cited

FOREIGN PATENT DOCUMENTS

CN    204928163 U      12/2015
SU       1617566 A1 *  12/1990

OTHER PUBLICATIONS

European Search Report Application No. EP 19 18 6462 Completed: Sep. 6, 2019; dated Sep. 19, 2019 17 pages.

Guillod Thomas et al: "Protection of MV/LV solid-state transformers in the distribution grid", IECON 2015—41st Annual Conference of the IEEE Industrial Electronics Society, IEEE. Nov. 9, 2015 8 pages.

J W Kolar et al: "Solid-State-Transformers: Key Componens of Future Traction and Smart Grid Systems Solid-State-Traction and Smart Grid Systems Solid-State-Transformers: Key Components of Future Traction and Smart Grid Systems", Proceedings of the International Power Electronics Conference—ECCE Asia, Mar. 18, 2014 16 pages.

\* cited by examiner

TRANSFORMER ASSEMBLY WITH MEDIUM FREQUENCY TRANSFORMERS

TECHNICAL FIELD

Aspects of the invention relate to a transformer assembly with medium frequency transformers (MFTs), in particular having transformer cells each comprising a converter and an MFT. Further aspects relate to a Solid State Transformer having such a transformer assembly.

BACKGROUND

There is high interest in medium frequency transformers (MFT) due to their potential to save weight and space. Herein, an MFT is defined as operating in a frequency range of 100 Hz to 100 kHz. This increased frequency allows shrinking of the magnetic components (the MFTs) due to the increased switching frequency, compared to conventional transformers operating at network frequencies of 50-60 Hz. Therefore, Solid State Transformers using MFTs have the potential to save space and weight, and in some cases cost, compared to conventional transformers even if additional frequency converters are needed.

FIG. 1 shows, as a comparative example, an exemplary transformer assembly for one phase of a solid state transformer (SST). The transformer assembly has an input 11 connected to a medium voltage grid of typically 11 kV (rms, line-to-line). The transformer assembly has a plurality of (here: 9) transformer cells 10 whose inputs (i.e. the inputs of their input converters 12) are connected to the medium voltage grid in a cascading manner. Each of the transformer cells 10 has an input converter 12, an MFT 14, and an output converter 16. In each cell 10, the output of the input converter 12 is connected to the input winding of MFT 14 at the MFT's frequency; and likewise the input of the output converter 16 is connected to the output winding of MFT 14 at the MFT's frequency. The outputs of the transformer cells 10 (i.e. the outputs of their output converters 16) are connected in a parallel to the output 18 of the transformer assembly.

In a solid state transformer (SST) the individual cells 10 typically need to meet defined insulation requirements with respect to the medium voltage network. For example, the insulation requirements include the ability to operate under nominal voltages without partial discharge; but also to withstand a higher withstand voltages, and in particular to withstand short high-voltage bursts of e.g. a lightning impulse.

For example, in a medium voltage network of 11 kV and with 9 cells, the nominal voltage for each cell is about 1 kV (the network voltage 11 kV rms line-to-line relates to a peak voltage of 9 kV in a Dy-configuration, which is divided by the number of cells). In addition, the cascaded cells must withstand higher voltages (for example, 2.5 times nominal voltage stress) without partial discharge.

Herein, unless stated otherwise, all AC voltages are understood to be rms voltages. Also, voltages refer to actual voltages including contributions from applied and induced voltages of windings. Here, the applied voltage is referred to as a voltage between a primary and a secondary winding, where the primary winding is entirely on one potential, and the secondary is entirely on another potential. For the first stage, because of the series connection of the cells on the grid side (input side), the applied voltage dominates.

The ability to withstand short high-voltage bursts of a lightning impulse is tested by a lightning impulse test.

Herein the lightning impulse test is understood to be the standard lightning impulse test as defined in the pertinent standards, e.g. in IEC 60076-11:2004. According to this test, each cell 10 must withstand a short high-voltage burst of 95 kV (peak) between the input 11 and the output 18 of the transformer assembly and thus in the worst case between the input and the output of each of the transformer cells 10.

The above example shows that the LI (lightning impulse) of 95 kV (peak) is considerably higher than any of the other voltages the transformer assembly needs to be able to withstand. Especially due to these requirements for the high-voltage lightning impulse (LI) test, much higher than the nominal voltage, the insulation distances have to be very large. These insulation distances result in each of the MFT cells being rather large and voluminous.

In order to fulfil the LI test conditions, furthermore, potting of the winding (e.g., an insulating epoxy encapsulation of the windings) is employed. This may result in further engineering challenges for cooling and regarding partial discharges. Additionally, large bushings are required for each MFT which further add to the cost and volume of the transformer.

Since the MFTs are required to fulfil the above insulation requirements irrespective of power, especially for small power the insulation due to the LI withstand requirements dominates the volume of each MFT. Therefore, in this domain one of the key advantages of MFT-based systems, i.e., their potential for small size and low weight, is critically reduced.

Thus, there is a need for an MFT-based transformer assembly in which the above disadvantages are at least reduced.

SUMMARY

In view of the above, a transformer assembly and a solid state transformer are provided.

According to a first aspect, the transformer assembly comprises a first transformer stage having a plurality of first-stage transformer cells, each of the first-stage transformer cells comprising a converter and a medium frequency transformer connected in series to each other; and a second transformer stage comprising at least one second-stage transformer cell, the second-stage transformer cell comprising a medium frequency transformer and a converter connected in series to each other. A lightning impulse breakdown voltage of the second-stage transformer cell is at least double of a lightning impulse breakdown voltage of one of the first-stage transformer cells. The lightning impulse breakdown voltage is the peak voltage of a lightning impulse between an input and an output of the respective transformer cell, at which the respective transformer cell breaks down during a lightning impulse test. The input of the second transformer stage is connected to the output of the first transformer stage.

According to a second aspect, there is provided a Solid State Transformer having the transformer assembly according to any of the preceding claims.

A potential advantage of this two-stage topology of the transformer assembly is that the insulation distances, especially in the first stage, can be significantly reduced, especially if no bushings and/or no potting is provided for the first-stage cells. As a result, considerable volume and weight savings are possible. Furthermore, the MFTs of both stages may be advantageously optimized for different requirements. These advantages are especially relevant for low power, e.g., up to 500 MW rated power.

The transformer assembly of the first aspect may also be used in a method for operating the transformer assembly and/or a solid state transformer comprising the same. The method comprises inputting an input DC or AC current to the first transformer stage, converting the inputted current to a medium frequency current (i.e. generating the medium frequency current as an output by using the input current's energy) using the converters of the first-stage transformer cells, and transforming the converted medium frequency current using the first-stage medium frequency transformers of the first-stage transformer cells; and transforming the transformed current (transformed by the first-stage transformer cell) to the second-stage transformer cell. The method may further include transforming the fed current using the at least one second-stage medium frequency transformer of the at least one second-stage transformer cell; and converting the resulting current using the converter of the at least one second-stage transformer cell.

Further advantages, features, aspects and details that can be combined with embodiments described herein are evident from the dependent claims, the description and the drawings.

BRIEF DESCRIPTION OF THE DRAWINGS

The details will be described in the following with reference to the figures, wherein.

DETAIL DESCRIPTION

Figure 2:
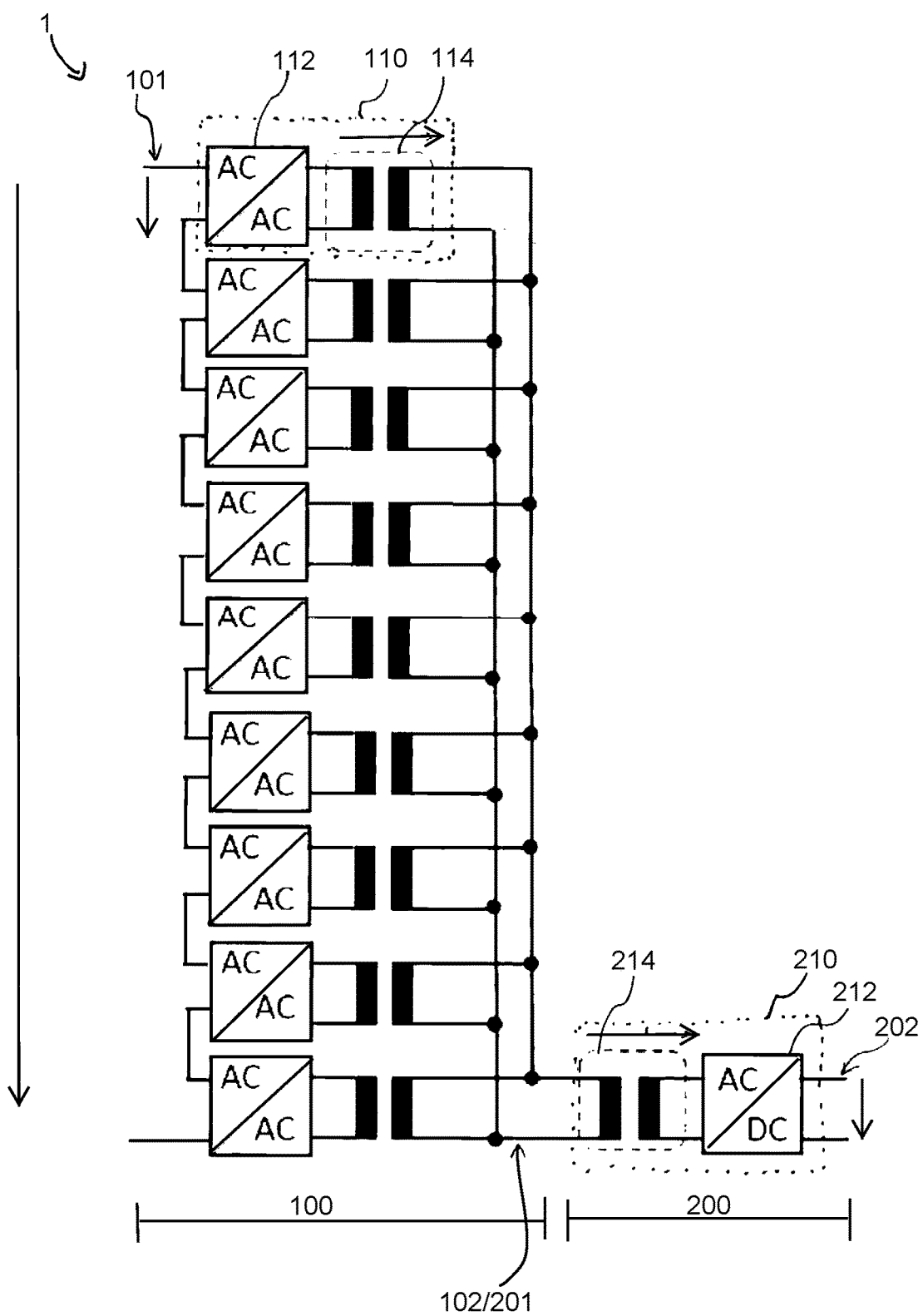
FIG. 2 is a schematic view of a transformer assembly according to an embodiment of the invention.

Reference will now be made in detail to various embodiments and aspects of the invention, some of which are illustrated in FIG. 2. Each example is provided by way of explanation and is not meant as a limitation. For example, features illustrated or described as part of one aspect or embodiment can be used on or in conjunction with any other aspect or embodiment. It is intended that the present disclosure includes such combinations, modifications and variations.

FIG. 2 shows a transformer assembly according to an embodiment of the invention. The transformer assembly comprises a first transformer stage 100 having a plurality of first-stage transformer cells 110 (in FIG. 2: nine transformer cells 110). Each of the first-stage transformer cells 110 comprises a converter 112 and a medium frequency transformer 114. The converter 112 and the medium frequency transformer 114 are connected in series to each other, so that an input of the converter 112 forms the input of the cell 110, an output of the converter 112 is connected to an input winding of the MFT 114, and an output winding of the MFT forms the output of the cell 110.

The inputs of the transformer cells 110 are connected in a cascading manner to each other between the input lines forming the input 101 of the first transformer stage 100. The outputs of the transformer cells 110 are connected in parallel to each other and form the output 102 of the first transformer stage 100 (low-voltage AC output).

The transformer assembly further comprises a second transformer stage 200. The second transformer stage 200 comprises a second-stage transformer cell 210. The second-stage transformer cell 210 comprises a medium frequency transformer 214 and a converter 212 connected in series to each other. An input winding of the MFT 214 forms the input of the cell 210, an output winding of the MFT 214 is connected to an input of the converter 212, and an output of the converter 212 forms the output of the cell 210.

The input of the cell 210 forms the input 201 of the second transformer stage 200. The input 201 of the second transformer stage 200 is connected to the output 102 of the first transformer stage 100. The output of the cell 210 forms the output 202 of the second transformer stage 200, and thereby of the transformer assembly. In the example of FIG. 2, the second-stage MFT 212 is a high-power MFT, rated for the total rated power of the transformer assembly. Alternatively, the single second-stage cell 210 can be replaced by a plurality of cells of corresponding lower ratings, arranged in parallel to each other.

Figure 1:
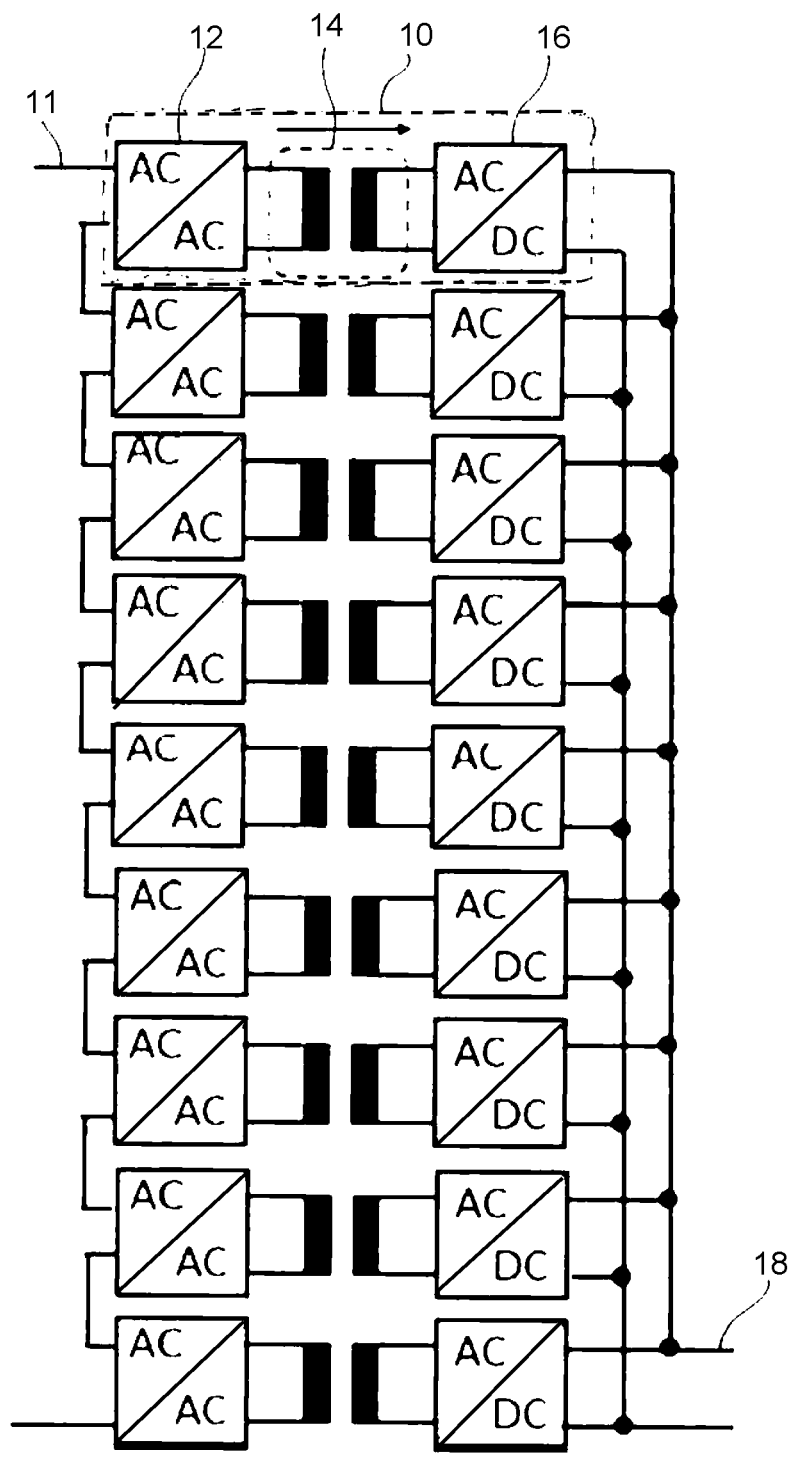
FIG. 1 is a schematic view of a transformer assembly being a comparative example.

Here, the input 101, 201 and output 102, 202 refer to groups (pairs) of conductor lines forming the respective input/output shown in FIG. 1. A connection between an input and an output means a connection from any one of the conductors of the input to any one of the conductors of the output, and in particular from each of the conductors of the input to a respective one of the conductors of the output.

The first-stage converters 112 are shown as AC-AC converters connectable to an AC network. But, alternatively, they can be DC-AC converters connectable to a DC network. Likewise, the second-stage converters 212 are shown as AC-DC converters connectable to a low-power DC component (energy source, load and/or DC network). Alternatively, it can be an AC-AC converter connectable to an AC component.

With the two-stage topology of the transformer assembly as shown in FIG. 2, it is sufficient that only the second stage 200 but not necessarily the first stage 100 meets the lightning impulse withstand requirements. The additional insulation requirements related to the lightning test, as described above with respect to the comparative example of FIG. 1, therefore only apply for the second stage 200 but not necessarily to the first stage 100. This high-power MFT ("second-stage") provides the insulation for 50 Hz-withstand test and lightning impulse (LI) test. The multiple first-stage-MFTs which are directly connected to the cells, provide insulation for the nominal operation, but don't have to be designed for the LI test.

More precisely, according to the invention, a lightning impulse breakdown voltage of the second-stage transformer cell 210 is at least double of a lightning impulse breakdown voltage of one of the first-stage transformer cells 110. Herein, the lightning impulse breakdown voltage is the peak voltage of a lightning impulse between an input 101, 201 and an output 102, 202 of the respective transformer cell 110, 210, at which the respective transformer cell 110, 210 breaks down during a lightning impulse test according to IEC 60076-11:2004.

From another point of view, the lightning impulse withstand voltage of the second-stage transformer cell 210 may be at least double of a lightning impulse withstand voltage of one of the first-stage transformer cells 110. Herein, the lightning impulse withstand voltage is defined as the maximum voltage of a lightning impulse between an input 101, 201 and an output 102, 202 of the respective transformer cell 110, 210, which the respective transformer cell 110, 210 withstands during a lightning impulse test according to IEC 60076-11:2004.

Thereby, due to the lower discharge requirements for the first stage 100, it is possible to use compact and lightweight components for the first stage 100. For example, the MFT only of the second stage 200 but not of the first stage 100 may require bushings.

For the first stage 100, it may be sufficient to be able to operate at nominal voltage (e.g., 9 kV(peak) phase-to-ground in a medium voltage grid of 11 kV rms line-to-line) and to withstand partial discharge at this voltage level. For example, for a network voltage (nominal rms voltage line-to-line) of 11 kV, the first stage 100 may be required to withstand a test voltage of 16.5 kV rms without partial discharge.

This requirement of the first stage 100 allows relatively small insulation distances. The winding window of the first-stage MFTs is, therefore, well utilized. A big advantage is that no bushings may be provided for the first-stage cells 110, whereby considerable volume and weight savings are possible. Although such bushings may be provided in the second-stage cells 210, in the example there is only a single second-stage cell 210 as opposed to 9 first-stage cells 110, so that there is a significant overall space and weight reduction. More generally, the number of second-stage cells 210 (in parallel to each other) is at most half of the number of first-stage cells 110, and preferably at most 3 cells, at most 2 cells, or even only 1 cell.

Furthermore, also regarding some further insulation requirements, e.g., for air insulation distances according to standards, it is sufficient if such insulation requirements are fulfilled by the second stage 200, but not necessarily by the first stage 100.

Thereby, the first stage components can be realized by simple, reliable and low-cost air-insulated MFTs. Therefore, efficiency and cost can be kept relatively low.

On the other hand, the first stage 100 may be better optimized for high-voltage conversion by the converters of the plurality of the first-stage cells being connected to the first-stage input in a cascading manner; and for continuous operation at higher voltages compared to the second stage.

For this purpose, the first-stage MFTs are advantageously unpotted. This allows the first-stage cells 110, which are subject to the highest insulation stresses, to be air-insulated. Thereby, cooling can be improved and the number of components that need to be considered for the long-term durability of the transformer assembly are reduced. This advantage is particularly pronounced in the case of the input 101 being connectable to a DC network, with associated DC insulation stresses.

Thus, overall, the MFTs of both stages can be much better optimized than a state-of-the-art single-stage MFT. Especially for low power this results in improved overall performance. This is especially the case for low power ratings of up to 500 kW and especially of up to 200 MW rated power, and/or of grid voltages at the input side of up to 52 kV, especially up to 18 kV. For these ranges, in contrast to the comparative example of FIG. 1, the size and volume savings due to insulation components related to the lightning impulse withstand requirements are particularly noticeable.

As a further advantage, the topology with two stages has the potential to significantly simplify the design of the insulation system of the whole SST including the cooling system. Furthermore, due to the two stages capable of being optimized for different requirements, the system allows additional freedom in design of the SST, and allows improved cell and system optimization, e.g., by selection of optimized semiconductor components for each of the stages.

While the foregoing is directed to embodiments, other and further embodiments may be devised without departing from the basic scope determined by the claims.

First, aspects relating to the first stage are described.

According to an aspect, respective inputs of the first-stage transformer cells 110 are connected in a cascading manner between input terminals 101 of the Transformer assembly (which also constitutes an input of the first stage 100). According to an aspect, windings of the medium frequency transformers 114 of the first-stage transformer cells 110 are unpotted and/or air-insulated. According to an aspect, the first transformer stage 100 has a rated nominal withstand voltage of at least 5 kV, preferably of at least 10 kV. According to an aspect, the first transformer stage 100 has a rated nominal withstand voltage of not more than 52 kV.

According to an aspect, the first stage comprises at least 2 first-stage cells 110, preferably at least six first-stage cells 110. According to an aspect, the first-stage cells have at least 10 kW and at most 100 kW, at most 50 kW, or only at most 30 kW power each.

Next, aspects relating to the second stage are described.

According to an aspect, the second stage has a single cell (or at most three cells) comprising a high-power MFT which is designed for fulfilling the LI test requirement. According to an aspect the transformer assembly is configured for subjecting the second stage to voltages of no more than 5 kV, preferably of no more than 2 kV, at nominal operation (relative to ground). Thereby, even if potted or otherwise insulated, the second stage is not subjected to large voltage stresses and resulting partial discharge issues.

According to an aspect, the MFT(s) of the second stage has is (are) insulated by a solid and/or liquid-insulation (e.g., oil-insulated). The solid insulation may have a breakdown strength of at least 1 kV and/or a thickness of at least 1 mm. Such a solid insulation may comprise a resin such as an epoxy resin, and/or may be obtained by potting or vacuum pressure impregnation.

According to an aspect, the second-stage MFT(s) has (have) terminals connected to the respective MFT through bushings (in particular, bushings designed to withstand a lightning impulse).

According to an aspect, the second transformer stage 200 has a lightning impulse breakdown voltage and/or a rated lightning impulse withstand voltage of at least 50 kV, preferably of at least 80 kV.

According to an aspect, the at least one second-stage transformer cell 210 is a single second-stage transformer cell 210, or alternatively a plurality of second-stage transformer cells 210 connected in parallel to each other. Thereby, several second-stage MFTs may be employed in parallel.

According to an aspect, the transformation ratio of the second transformer stage 200 is between 1.0 and 10.0, and/or to not more than 3.0 or even not more than 2.0. According to an aspect, the transformation ratio of the second-stage MFT(s) is 1:1. The 1:1 ratio may, for example, allow transformer windings by coaxial cables.

According to an aspect, the converter 212 of the second-stage transformer cell 210 is one of an AC-to-DC converter or an AC-to-AC converter. In case of an AC-to-AC converter, the DC link may optionally provide an additional DC connection.

Next, aspects relating to the comparison of the first and second stages are described.

According to an aspect, the first- and second-stage transformer cells have mutually different insulation properties. In the Summary of Invention (and in claim 1), this difference has been expressed in terms of the different lightning impulse breakdown voltage of the first- and second-stage transformer cells—namely, that the lightning impulse breakdown voltage of the second-stage transformer cell (e.g., of any one of the at least one second-stage transformer cell) is at least double of a lightning impulse breakdown voltage of one of the first-stage transformer cells. Herein, the lightning impulse breakdown voltage is the (minimum) peak voltage of a lightning impulse between an input and an output of the respective transformer cell, at which the respective transformer cell breaks down during a lightning impulse test.

The different insulation properties can also be defined in a different manner, and some such definitions are given in the following aspects of the invention. The present disclosure shall encompass transformer cells with any combination of these differences, i.e., in which an alternative definition may be given instead of or in addition to the above definition in terms of the lightning impulse breakdown voltage.

For example, according to a further aspect, a lightning impulse withstand voltage of the second-stage transformer cell may be at least double of a lightning impulse withstand voltage of one of the first-stage transformer cells. Herein, the lightning impulse withstand voltage defines the voltage of a lightning impulse between an input and an output of the respective transformer cell, which the respective transformer cell is rated to withstand during a lightning impulse test.

According to a further aspect, the transformer assembly comprises two stages, each having MFTs with different insulations systems, so that the MFTs of the first stage are designed with a different insulation system than the MFT(s) of the second stage. In particular, the insulation of the first stage is designed for nominal medium voltage (e.g. 10 kV . . . 50 kV) but not for LI pulse protection, and the insulation strength of the second stage is designed for nominal low voltage (e.g. 0.2 kV . . . 2 kV) and for LI pulse protection, the LI pulse having a voltage of at least three times of the nominal voltage.

According to an aspect, the winding of the medium frequency transformer 214 of the second-stage transformer cell 210 is encapsulated by an additional (and/or thicker) solid- or liquid-insulator encapsulation, compared to corresponding windings of the medium frequency transformers 114 of the first-stage transformer cells 110. A corresponding solid- or liquid-insulator encapsulation may be absent (or thinner) from the windings of the first-stage medium frequency transformers 114.

According to an aspect, the medium frequency transformer 214 of the second-stage transformer cell 210 has an additional (or larger) bushing connecting a terminal to a winding of the medium frequency transformer 214, whereas the medium frequency transformers 114 of the first-stage transformer cells 110 lack a corresponding bushing, i.e., lacks a bushing of comparable dimensions, i.e., has no bushing or smaller bushing (e.g. half the size or smaller). The bushing may be a solid encapsulation of the conductor portion leading to the winding of the respective medium frequency transformer (e.g., between the terminal and the medium frequency transformer's winding), having a high breakdown strength (above 1 kV) and typically a thickness of at least 1 mm. The bushing may be integrated into the solid insulator encapsulation, or may be provided as a separate piece, possibly in direct contact with the insulator encapsulation. In such a case, the size of the bushing can be defined as the clearance distance between the respective exits of a pair of bushings. Thus, according to an aspect, the clearance distance between any pair of bushing exits of the medium frequency transformer of the at least one second-stage transformer cell 210 is larger than a clearance distance of a corresponding conductor pair of a medium frequency transformer of any one of the first-stage transformer cells 110.

According to a further aspect, the at least one second-stage transformer cell 210 has a larger clearance distance between a conductor connected to the winding and a grounded part than any one of the first-stage transformer cells 110.

According to a further aspect, a winding of the medium frequency transformer 214 of the second-stage transformer cell 210 has an additional solid or liquid insulation compared to the medium frequency transformer of any one of the first-stage transformer cells 110. Thereby, the insulation of the second-stage medium frequency transformer 214 may be, e.g., thicker and/or have a higher breakdown voltage than the first-stage medium frequency transformer 114. For example, the medium frequency transformer 214 of the second-stage transformer cell 210 may be liquid-insulated and/or solid-insulated (e.g., by potting or vacuum pressure impregnation), whereas the windings of the medium frequency transformers (114) of the first-stage transformer cells (110) may lack a corresponding insulation (of comparable thickness and/or breakdown strength, e.g., no insulation by a thickness of 1 mm or more), e.g., may be non-liquid-insulated, non-potted, and non-insulated by vacuum pressure impregnation.

According to an aspect, the transformation ratio of the first transformer stage 100 is more than the transformation ratio of the second transformer stage 200. Herein, the transformation ratio is defined as the input voltage divided by the transformed output voltage of the respective transformer stage.

According to an aspect, any one of the medium frequency transformers 114 of the first-stage transformer cells 110 has at most half the mass and/or half the volume of the medium frequency transformer 214 of any one of the at least one second-stage transformer cell 210.

According to an aspect, the number of cells 110 of the first transformer stage 100 is more than the number of cells 210 of the second transformer stage 200, preferably by at least a factor 1.5, by a factor 2.0, or even by a factor 3.0.

According to an aspect, the number of first-stage transformer cells 110 of the first transformer stage 100 is larger than the number of the at least one second-stage transformer cell 210 of the second transformer stage 200, preferably by a factor of at least 2, and particularly preferably by a factor of at least 4.

According to an aspect, the transformation ratio of the second transformer stage 200 is smaller than that of the first transformer stage 100, by at least 50% of the transformation ratio of the first transformer stage 100.

Next, aspects relating to interconnections within the transformer assembly are described.

According to an aspect, the first and second stages 100, 200 are connected in series to each other between input and output terminals 101, 202 of the Transformer assembly, so that an input of the second stage 200 is an output of the first stage 100.

According to an aspect, respective outputs of the first-stage transformer cells 110 are connected, in parallel to each other, to the output 102 of the first stage 100 and thereby to the input 201 of the second stage.

According to an aspect, the transformer assembly is configured for the input terminal at the input 101 of the first transformer stage being connected to a higher nominal voltage, and for an output terminal at the output 202 of the second transformer stage being connected to a lower nominal voltage.

Next, further aspects relating to the transformer assembly and its parameters are described.

According to an aspect, the transformer assembly is comprised in a Solid State Transformer (SST). According to an aspect, a surge arrester is connected to the input of the transformer assembly. According to an aspect, the surge arrester is configured for limiting the voltage stress on the first-stage MFTs to a value below their dielectric strength.

According to an aspect, The Solid State Transformer comprises a plurality of transformer assemblies as described herein, e.g., one or more for each phase.

According to an aspect, the transformer assembly is adapted for an input voltage of up to 52 kV, preferably of up to 18 kV (e.g., a medium voltage grid), and/or of at least 1 kV, preferably at least 5 kV, being connected to the input of the transformer assembly. According to an aspect, the transformer assembly is adapted for an output voltage of no more than 1 kV, and/or of at least 110 V, preferably at least 230 V, in particular at least 300 V (e.g., a low voltage grid) being connected to the input of the transformer assembly.

According to an aspect, the transformer assembly is adapted for a power of at least 100 kW, and/or at most 100 MW, preferably at most 1 MW.

According to an aspect, the SST is used for connecting a renewable energy source such as solar or wind, a battery, and/or an electric vehicle on its output to a grid at its input. Herein, the term "input" is used for a higher-voltage side, and the term "output" is used for a lower-voltage side, but does not imply a direction of power flow. The SST may be configured for transmitting power from the input to the output, or from the output to the input, or both.

The invention claimed is:

1. A transformer assembly comprising:
   a first transformer stage having a plurality of first-stage transformer cells, each of the first-stage transformer cells comprising a converter and a medium frequency transformer connected in series to each other, wherein the respective inputs of each of the plurality of first-stage transformer cells are connected in series and the respective outputs of each of the plurality first-stage transformer cells are connected in parallel to form the output of the first transformer stage; and
   a second transformer stage comprising at least one second-stage transformer cell, the second-stage transformer cell comprising a medium frequency transformer and a converter connected in series to each other, wherein
   a lightning impulse breakdown voltage of the at least one second-stage transformer cell is at least double of a lightning impulse breakdown voltage of one of the first-stage transformer cells, wherein the lightning impulse breakdown voltage is the peak voltage of a lightning impulse between an input and an output of the respective transformer cell, at which the respective transformer cell breaks down during a lightning impulse test, and wherein
   an input of the second transformer stage is connected to the output of the first transformer stage.

2. The transformer assembly according to claim 1, wherein the at least one second-stage transformer cell is a plurality of second-stage transformer cells connected in parallel to each other.

3. The transformer assembly according to claim 1, wherein the transformation ratio of the first transformer stage is more than the transformation ratio of the second transformer stage.

4. The transformer assembly according to claim 1, wherein the transformation ratio of the second transformer stage is between 1.0 and 10.0.

5. The transformer assembly according to claim 1, wherein a winding of the medium frequency transformer of the at least one second-stage transformer cell has an additional solid or liquid insulation compared to the plurality of first-stage transformer cells.

6. The transformer assembly according to claim 1, wherein the number of first-stage transformer cells of the first transformer stage is larger than the number of the at least one second-stage transformer cell of the second transformer stage, preferably by a factor of at least 2, and particularly preferably by a factor of at least 4.

7. The transformer assembly according to claim 1, wherein the medium frequency transformer of the at least one second-stage transformer cell includes at least one bushing designed for withstanding a lightning impulse.

8. The transformer assembly according to claim 1, wherein the medium frequency transformers of any one of the plurality of first-stage transformer cells has at most half the mass of the medium frequency transformer of any one of the at least one second-stage transformer cell.

9. The transformer assembly according to claim 1, wherein respective outputs of the plurality of first-stage transformer cells are connected to the output of the first transformer stage and thereby to the input of the second transformer stage.

10. The transformer assembly according to claim 1, having a higher-voltage input terminal at the input of the first transformer stage, and a lower-voltage output terminal at the output of the second transformer stage.

11. The transformer assembly according to claim 1, wherein the converter of the at least one second-stage transformer cell is one of an AC-to-DC converter or an AC-to-AC converter.

12. The transformer assembly according to claim 1, wherein an input of the transformer assembly is connected to a surge arrester.

13. The transformer assembly according to claim 1, wherein the input of each of the medium frequency transformers of the plurality of first-stage transformer cells is connected to a surge arrester.

14. A solid state transformer having a transformer assembly, including:
   a first transformer stage having a plurality of first-stage transformer cells, each of the first-stage transformer cells comprising a converter and a medium frequency transformer connected in series to each other, wherein the respective inputs of each of the plurality of first-stage transformer cells are connected in series and the respective outputs of each of the plurality first-stage transformer cells are connected in parallel to form the output of the first transformer stage; and
   a second transformer stage comprising at least one second-stage transformer cell, the second-stage transformer cell comprising a medium frequency transformer and a converter connected in series to each other, wherein
   a lightning impulse breakdown voltage of the at least one second-stage transformer cell is at least double of a lightning impulse breakdown voltage of one of the first-stage transformer cells, wherein the lightning impulse breakdown voltage is the peak voltage of a lightning impulse between an input and an output of the respective transformer cell, at which the respective transformer cell breaks down during a lightning impulse test, and wherein
   an input of the second transformer stage is connected to the output of the first transformer stage.

15. The transformer assembly according to claim 14, wherein the at least one second-stage transformer cell is a plurality of second-stage transformer cells connected in parallel to each other.

16. The transformer assembly according to claim 14, wherein the transformation ratio of the first transformer stage is more than the transformation ratio of the second transformer stage.

17. The transformer assembly according to claim 14, wherein the transformation ratio of the second transformer stage is between 1.0 and 10.0.

18. The transformer assembly according to claim 14, wherein a winding of the medium frequency transformer of the at least one second-stage transformer cell has an additional solid or liquid insulation compared to the plurality of first-stage transformer cells.

\* \* \* \* \*